United States Patent
Chen et al.

(10) Patent No.: US 12,360,413 B2
(45) Date of Patent: Jul. 15, 2025

(54) SPLICING DISPLAY PANEL AND ELECTRONIC DEVICE

(71) Applicant: TCL CHINA STAR OPTOELECTRONICS TECHNOLOGY CO., LTD., Guangdong (CN)

(72) Inventors: Yao Chen, Guangdong (CN); Min Wang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/623,819

(22) PCT Filed: Dec. 22, 2021

(86) PCT No.: PCT/CN2021/140604
§ 371 (c)(1),
(2) Date: Dec. 29, 2021

(87) PCT Pub. No.: WO2023/115413
PCT Pub. Date: Jun. 29, 2023

(65) Prior Publication Data
US 2025/0004314 A1    Jan. 2, 2025

(30) Foreign Application Priority Data
Dec. 20, 2021 (CN) .......................... 202111566811.4

(51) Int. Cl.
G02F 1/1333 (2006.01)
G02F 1/1335 (2006.01)
H05K 1/18 (2006.01)

(52) U.S. Cl.
CPC .... *G02F 1/13336* (2013.01); *G02F 1/133528* (2013.01); *H05K 1/189* (2013.01); *H05K 2201/10136* (2013.01)

(58) Field of Classification Search
CPC ........... G02F 1/13336; G02F 1/133528; G02F 1/1333; H05K 1/189; G09F 9/302
See application file for complete search history.

(56) References Cited

FOREIGN PATENT DOCUMENTS

| CN | 207009016 U | 2/2018 |
|---|---|---|
| CN | 111290154 A | 6/2020 |

(Continued)

OTHER PUBLICATIONS

WO 2022227983 A1 machine translation (Year: 2022).*

(Continued)

*Primary Examiner* — Anne M Hines
*Assistant Examiner* — Jose M Diaz
(74) *Attorney, Agent, or Firm* — PV IP PC Chung, Wei Te

(57) ABSTRACT

A splicing display panel and an electronic device are disclosed. The splicing display panel includes a first display module, a second display module, a third display module, a first magnetic member and a second magnetic member, the second display module located on a side of the first display module, the second display module and the first display module are spliced to form a seam, the third display module disposed on the first display module and the second display module, wherein the third display module shields the seam, the second magnetic member is attracted to the first magnetic member.

20 Claims, 3 Drawing Sheets

(56) References Cited

FOREIGN PATENT DOCUMENTS

| | | | |
|---|---|---|---|
| CN | 111653207 | A | 9/2020 |
| CN | 211654136 | U | 10/2020 |
| CN | 211654163 | U | 10/2020 |
| CN | 214669956 | U | 11/2021 |
| KR | 20170000575 | A | 1/2017 |
| TW | 201539403 | A | 10/2015 |
| WO | 2021012458 | A1 | 1/2021 |
| WO | 2021212583 | A1 | 10/2021 |
| WO | WO-2022227983 | A1 * | 11/2022 |

OTHER PUBLICATIONS

International Search Report in International application No. PCT/CN2021/140604, mailed on Aug. 25, 2022.

Written Opinion of the International Search Authority in International application No. PCT/CN2021/140604, mailed on Aug. 25, 2022.

Chinese Office Action issued in corresponding Chinese Patent Application No. 202111566811.4 dated Jul. 25, 2022, pp. 1-12.

* cited by examiner

SPLICING DISPLAY PANEL AND ELECTRONIC DEVICE

BACKGROUND OF INVENTION

Field of Invention

The present application relates to the field of display technology, and more particularly to a splicing display panel and an electronic device.

Description of Prior Art

With the development of display technology, large-size splicing display panel has gradually become a hot spot. At present, a splicing display panel mainly includes liquid crystal display (LCD) splicing display panel, light-emitting-diode (LED) splicing display panel and organic light-emitting diode (OLED) splicing display panel, which can be single screen display, or any combination of display, and can be spliced into a large screen display.

In a traditional splicing display panel, there is a design difference between a narrow border and a wide border. The traditional splicing display panels generally use narrow border, and various seam-removing technologies are derived on this basis. However, a width of a splicing seam in the current splicing display panel is decreasing, but the splicing seam in the splicing display panel still cannot be eliminated, and there is always a defect in the visual effect, that is, when the splicing display panel is displayed, the area where the splicing seam is located is black, that is, there is a dark shadow on the display screen, which affects the continuity and integrity of the display screen.

Therefore, it is necessary to propose a new technical solution to solve the above technical problems.

SUMMARY OF INVENTION

An embodiment of the present application provides a splicing display panel and an electronic device, which are used to improve a shadow of a splicing display panel at a seam.

The present application provides a splicing display panel, comprising:
  a first display module comprises a first substrate and a second substrate, wherein the second substrate is disposed on the first substrate;
  a second display module located on a side of the first display module, wherein the second display module comprises a third substrate and a fourth substrate, the fourth substrate is disposed on the third substrate, the second display module and the first display module are spliced to form a seam;
  a third display module disposed on the first display module and the second display module, wherein the third display module shields the seam;
  a first magnetic member disposed on a surface of the third display module close to the first display module and the second display module;
  a second magnetic member disposed on at least one of the first substrate and the third substrate, wherein the second magnetic member is attracted to the first magnetic member.

The splicing display panel provided by the embodiments of the present application can not only improve the shadow of the splicing display panel at the seam, but also can realize rapid splicing, thereby improving production efficiency.

In the splicing display panel of the present application, the first substrate comprises a first side close to the second display module, the second substrate comprises a second side close to the second display module, and a distance from the first side of the first substrate to the second display module is less than a distance from the second side of the second substrate to the second display module;
  the second side of the second substrate, the exposed surface of the first substrate close to the second substrate and the side of the second display module close to the first display module are surrounded to form a notch, and the second magnetic member is disposed in the notch.

The splicing display panel provided by the embodiments of the present application disposed the second magnetic member in the notch, the thickness of the splicing display panel will not be increased, so as to realize the lightness and thinness of the splicing display panel.

In the splicing display panel of the present application, the first display module further comprises a first polarizer, and the first polarizer is disposed on the second substrate;
  the second display module further comprises second polarizer, the second polarizer is disposed on the fourth substrate;
  the second magnetic member disposed on the first substrate and attached to the second side of the second substrate, and the second magnetic member is flush with the second substrate;
  a part of the first magnetic member is attached to a surface of the second magnetic member away from the first substrate, the first magnetic member is attached to a first side of the first polarizer and a first side of the second polarizer, and the first magnetic member is flush with the first polarizer.

The splicing display panel provided by the embodiments of the present application can not only improve the shadow of the splicing display panel at the seam, but also can realize rapid splicing, thereby improving production efficiency. And the first magnetic member is flush with the first polarizer, and the second magnetic member is flush with the second substrate, the thickness of the splicing display panel will not be increased, so as to realize the lightness and thinness of the splicing display panel.

In the splicing display panel of the present application, the first magnetic member comprises at least one of a magnetic coating, a magnetic adhesive layer and a magnet, and the second magnetic member comprises at least one of the magnetic coating and the magnetic adhesive layer.

The magnetic adhesive layer of the splicing display panel provided by the embodiments of the present application can be directly attached to the first substrate and the second side of the second substrate. Therefore, when the first magnetic member and the second magnetic member are magnetic adhesive layers, the magnetic adhesive layer is firmly attached to the first substrate and the second substrate, thereby improving the stability of the splicing display panel.

In the splicing display panel of the present application, the magnetic coating is made of magnetic particles mixed with organic polymers.

The magnetic particles of the splicing display panel provided by the embodiments have the advantages of strong adsorption capacity and wide acquisition channels.

In the splicing display panel of the present application, the magnetic adhesive layer is made of magnetic particles mixed with optical adhesives.

The magnetic adhesive layer of the splicing display panel provided by the embodiments of the present application can be directly attached to the first substrate and the second side of the second substrate. Therefore, when the first magnetic member and the second magnetic member are magnetic adhesive layers, the magnetic adhesive layer is firmly attached to the first substrate and the second substrate, thereby improving the stability of the splicing display panel.

In the splicing display panel of the present application, the magnetic particles comprise at least one of iron, cobalt, nickel, manganese or metal oxides of iron, cobalt, nickel, manganese.

The magnetic metal oxides such as iron, cobalt, nickel, manganese or metal oxides of iron, cobalt, nickel, and manganese provided by the embodiments of the present application have the advantages of strong adsorption capacity and wide acquisition channels.

In the splicing display panel of the present application, when the first magnetic member is one of the magnetic coating or the magnet, the splicing display panel further comprises a first adhesive layer, the first adhesive layer is disposed on the first side of the first polarizer and the first side of the second polarizer, and the first adhesive layer is used for bonding the first magnetic member with the first polarizer and the second polarizer.

The first adhesive layer of the splicing display panel provided by the embodiment of the application is used to bond the first magnetic member with the first polarizer and the second polarizer to prevent the first magnetic member falling off, so as to improve the stability of the splicing display panel.

In the splicing display panel of the present application, when the second magnetic member is the magnetic coating, the splicing display panel further comprises a second adhesive layer, the second adhesive layer is disposed on the side of the first substrate close to the second magnetic member, and the second adhesive layer is disposed on the second side of the second substrate, and the second adhesive layer is used for bonding the magnetic coating with the first substrate and the second substrate.

The second adhesive layer of the splicing display panel provided by the embodiment of the present application is used to bond the magnetic coating with the first substrate and the second substrate to prevent the second magnetic member falling off, so as to improve the stability of the splicing display panel.

In the splicing display panel of the present application, wherein a width of the second magnetic member is less than or equal to 3 microns.

The width of the second magnetic member is defined to be less than or equal to 3 microns in the splicing display panel provided by the embodiment of the present application, so that the second magnetic member has a sufficient width to fit the first substrate and the second substrate to prevent the second magnetic member falling off, thereby further improving the stability of the splicing display panel.

In the splicing display panel of the present application, the splicing display panel further comprises a first liquid crystal layer disposed between the first substrate and the second substrate and a third polarizer disposed on the side of the first substrate away from the second substrate, the first substrate is a driving substrate and the second substrate is a color film substrate;

the splicing display panel further comprises a second liquid crystal layer disposed between the third substrate and the fourth substrate and a fourth polarizer disposed on the side of the third substrate away from the fourth substrate, the third substrate is a driving substrate and the fourth substrate is a color film substrate;

the third display module comprises a flexible circuit board, the flexible circuit board is disposed between the first display module and the second display module, and the third display module is a mini light-emitting diode (LED) display module or a micro LED display module.

The splicing display panel provided by the embodiment of the present application uses a mini LED display module or a micro LED display module to splice the liquid crystal display panel to improve the shadow of the splicing display panel at the seam. The flexible circuit board disposed between the first display module and the second display module, which reduces the thickness of the third display module and further reduces the thickness of the spliced display panel.

In the splicing display panel of the present application, the third display module further comprises an array substrate and a display unit disposed on the array substrate, the display unit is electrically connected with the array substrate, the flexible circuit board is electrically connected with the array substrate, and the flexible circuit board is disposed in the seam through a through hole of the first magnetic member.

The flexible circuit board of the embodiment of the present application disposed in the seam where the first display module and the second display module are spliced, so that the thickness of the third display module will not increase, so as to realize the lightness and thinness of the splicing display panel.

In the splicing display panel of the present application, the flexible circuit board is disposed on the surface of the array substrate away from the display unit, and the flexible circuit board is disposed in the seam through the through hole.

The flexible circuit board of the embodiment of the present application disposed on the side of the array substrate away from the display unit, so that the thickness of the third display module will not increase, so as to realize the lightness and thinness of the splicing display panel.

In the splicing display panel of the present application, the flexible circuit board is disposed on the side of the array substrate, and the flexible circuit board is bent into the seam through the through hole from the side of the array substrate;

the third display module further comprises a planarization layer disposed on the surface of the array substrate away from the display unit, wherein, the planarization layer is used to flatten the gap formed between the array substrate and the first magnetic member when the flexible circuit board is bent into the seam through the through hole from the side of the array substrate.

When the flexible circuit board in the embodiment of the present application is bent from the side of the array substrate through the through hole h into the seam P, there is a gap between the surface of the array substrate away from the display unit and the first magnetic member, and the planarization layer is used to flatten the gap, thereby improving the flatness of the splicing display panel and further improving the stability of the splicing display panel.

In the splicing display panel of the present application, the third display module further comprises a magnetic layer, the magnetic layer is disposed above the first display module and the second display module, and the magnetic layer is attracted to the first magnetic member.

The magnetic layer of the splicing display panel provided by the embodiments of the present application can not only improve the shadow of the splicing display panel at the seam, but also can realize rapid splicing, thereby improving production efficiency.

The present application also provides an electronic device, comprising a shell and a splicing display panel, the splicing display panel is disposed in the shell, and the splicing display panel comprises:

a first display module comprises a first substrate and a second substrate, wherein the second substrate is disposed on the first substrate;

a second display module located on a side of the first display module, wherein the second display module comprises a third substrate and a fourth substrate, the fourth substrate is disposed on the third substrate, the second display module and the first display module are spliced to form a seam;

a third display module disposed on the first display module and the second display module, wherein the third display module shields the seam;

a first magnetic member disposed on a surface of the third display module close to the first display module and the second display module;

a second magnetic member disposed on at least one of the first substrate and the third substrate, wherein the second magnetic member is attracted to the first magnetic member.

The electronic device provided by the embodiments of the present application can not only improve the shadow of the splicing display panel at the seam, but also can realize rapid splicing, thereby improving production efficiency.

In the electronic device of the present application, the first substrate comprises a first side close to the second display module, the second substrate comprises a second side close to the second display module, and a distance from the first side of the first substrate to the second display module is less than a distance from the second side of the second substrate to the second display module;

the second side of the second substrate, the exposed surface of the first substrate close to the second substrate and the side of the second display module close to the first display module are surrounded to form a notch, and the second magnetic member is disposed in the notch.

The electronic device provided by the embodiments of the present application disposed the second magnetic member in the notch, the thickness of the splicing display panel will not be increased, so as to realize the lightness and thinness of the splicing display panel.

In the electronic device of the present application, the first display module further comprises a first polarizer, and the first polarizer is disposed on the second substrate;

the second display module further comprises second polarizer, the second polarizer is disposed on the fourth substrate;

the second magnetic member disposed on the first substrate and attached to the second side of the second substrate, and the second magnetic member is flush with the second substrate;

a part of the first magnetic member is attached to the surface of the second magnetic member away from the first substrate, the first magnetic member is attached to a first side of the first polarizer and a first side of the second polarizer, and the first magnetic member is flush with the first polarizer.

The electronic device provided by the embodiments of the present application can not only improve the shadow of the splicing display panel at the seam, but also can realize rapid splicing, thereby improving production efficiency. And the first magnetic member is flush with the first polarizer, and the second magnetic member is flush with the second substrate, the thickness of the splicing display panel will not be increased, so as to realize the lightness and thinness of the splicing display panel.

In the electronic device of the present application, the splicing display panel further comprises a first liquid crystal layer disposed between the first substrate and the second substrate and a third polarizer disposed on the side of the first substrate away from the second substrate, the first substrate is a driving substrate and the second substrate is a color film substrate;

the splicing display panel further comprises a first liquid crystal layer disposed between the third substrate and the fourth substrate and a fourth polarizer disposed on the side of the third substrate away from the fourth substrate, the third substrate is a driving substrate and the fourth substrate is a color film substrate;

the third display module comprises a flexible circuit board, the flexible circuit board is disposed between the first display module and the second display module, and the third display module is a mini light-emitting diode (LED) display module or a micro LED display module.

The electronic device provided by the embodiment of the present application uses a mini LED display module or a micro LED display module to splice the liquid crystal display panel to improve the shadow of the splicing display panel at the seam. The flexible circuit board disposed between the first display module and the second display module, which reduces the thickness of the third display module and further reduces the thickness of the spliced display panel.

In the electronic device of the present application, the third display module further comprised a magnetic layer, the magnetic layer is disposed above the first display module and the second display module, and the magnetic layer is attracted to the first magnetic member.

The magnetic layer of the splicing display panel provided by the embodiments of the present application can not only improve the shadow of the splicing display panel at the seam, but also can realize rapid splicing, thereby improving production efficiency.

Advantageous Effects

The embodiment of the present application provides a splicing display panel, which includes a first display module, a second display module, a third display module, a first magnetic member and a second magnetic member. The first display module includes a first substrate and a second substrate, wherein the second substrate is disposed on the first substrate. The second display module located on a side of the first display module, wherein the second display module includes a third substrate and a fourth substrate, the fourth substrate is disposed on the third substrate, the second display module and the first display module are spliced to form a seam. The third display module disposed on the first display module and the second display module, wherein the third display module shields the seam. The first magnetic member disposed on a surface of the third display module close to the first display module and the second display module. The second magnetic member disposed on at least one of the first substrate and the third substrate. The second magnetic member is attracted to the first magnetic member.

Since the first display module and the second display module are spliced to form the seam, in the embodiment of the present application, the third display module is disposed above the first display module and the second display module, and which shields the seam. In addition, the first magnetic member disposed on the surface of the third display module close to the first display module and the second display module, which is attracted to the second magnetic member located on at least one of the first substrate and the third substrate, thereby realizing rapid splicing. The splicing display panel provided by the embodiments of the present application can not only improve the shadow of the splicing display panel at the seam, but also can realize rapid splicing, thereby improving production efficiency.

BRIEF DESCRIPTION OF DRAWINGS

In order to more clearly illustrate the embodiments or the technical solutions of the existing art, the drawings illustrating the embodiments or the existing art will be briefly described below. The drawings in the following description merely illustrate some embodiments of the present application. Other drawings may also be obtained by those skilled in the art according to these figures without paying creative work.

DETAILED DESCRIPTION OF PREFERRED EMBODIMENTS

Figure 1:
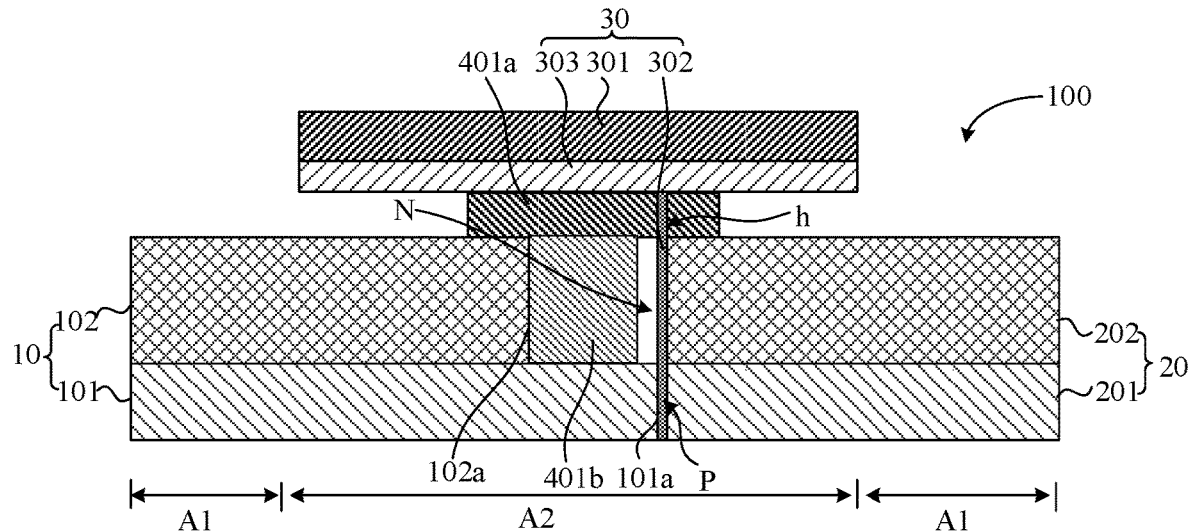
FIG. 1 is a schematic diagram of a first structure of a splicing display panel of one embodiment of the present application.

In order to make the objective, technical solution and advantages of the present application clearer, the present application will be further described in detail below with reference to the accompanying drawings. Referring to the figures in the accompanying drawings. The components with the same reference numbers represent the same or similar components. The following description is based on the illustrated specific embodiments of the present disclosure, and should not be construed to limit the other specific embodiments which are not described in detail herein. The word "embodiment" configured in this specification means an example, example, or illustration.

In the description of the present disclosure, it is to be understood that the azimuth or positional relationships indicated by the terms "center", "longitudinal", "transverse", "length", "width", "thickness", "upper", "lower", "front", "back", "left", "right", "vertical", "horizontal", "top", "bottom", "inside", "outside", "clockwise", "counter-clockwise", etc., are based on the azimuth or positional relationship shown in the drawings, merely for the purpose of assisting and simplify the description, rather than indicating or implying that the indicated device or element must have a specific orientation, and be constructed and operated in a particular orientation. Therefore, these terms cannot be construed as limiting the present disclosure. In addition, the terms "first" and "second" are only configured for descriptive purposes, and cannot be understood as indicating or implying relative importance or implicitly indicating the number of indicated technical features. Therefore, the features defined with "first" and "second" may explicitly or implicitly include one or more of the features. In the description of the present application, "a plurality of" means two or more than two, unless otherwise specifically defined.

An embodiment of the present application provides a splicing display panel and an electronic device. Detailed descriptions are given below. It should be noted that the order of description in the following embodiments is not meant to limit the preferred order of the embodiments.

The embodiment of the present application provides a splicing display panel, which includes a first display module, a second display module, a third display module, a first magnetic member and a second magnetic member. The first display module includes a first substrate and a second substrate, wherein the second substrate is disposed on the first substrate. The second display module located on a side of the first display module, wherein the second display module includes a third substrate and a fourth substrate, the fourth substrate is disposed on the third substrate, the second display module and the first display module are spliced to form a seam. The third display module disposed on the first display module and the second display module, wherein the third display module shields the seam. The first magnetic member disposed on a surface of the third display module close to the first display module and the second display module. The second magnetic member disposed on at least one of the first substrate and the third substrate. The second magnetic member is attracted to the first magnetic member.

Since the first display module and the second display module are spliced to form the seam, therefore, in the embodiment of the present application, the third display module is disposed above the first display module and the second display module, and which shields the seam. In addition, the first magnetic member disposed on the surface of the third display module close to the first display module and the second display module, which is attracted to the second magnetic member located on at least one of the first substrate and the third substrate, thereby realizing rapid splicing. The splicing display panel provided by the embodiments of the present application can not only improve the shadow of the splicing display panel at the seam, but also can realize rapid splicing, thereby improving production efficiency.

The splicing display panel provided in the present application will be described in detail below through specific embodiments.

Referring to FIG. 1, FIG. 1 is a schematic diagram of a first structure of a splicing display panel of one embodiment of the present application.

The splicing display panel 100 has a first display part A1 and a second display part A2, the first display part A1 is located on both sides of the second display part A2, wherein the second display part A2 is a splicing display part.

The splicing display panel 100 includes a first display module 10, a second display module 20, a third display module 30, a first magnetic member 401a and a second magnetic member 401b. The first display module 10 includes a first substrate 101 and a second substrate 102, wherein the second substrate 102 is disposed on the first substrate 101. The second display module 20 located on a side of the first display module 10, wherein the second display module 20 includes a third substrate 201 and a fourth substrate 202, the fourth substrate 202 is disposed on the third substrate 201, the second display module 20 and the first display module 10 are spliced to form a seam P. The third display module 30 disposed on the first display module 10 and the second display module 20, wherein the third display module 30 shields the seam P. The first magnetic member 401a disposed on a surface of the third display module 30 close to the first display module 10 and the second display module 20. The second magnetic member 401b disposed on the first substrate 101. The second magnetic member 401b is attracted to the first magnetic member 401a.

Since the first display module 10 and the second display module 20 are spliced to form the seam P, therefore, in the embodiment of the present application, the third display module 30 is disposed above the first display module 10 and the second display module 20, and which shields the seam P. In addition, the first magnetic member 401a disposed on the surface of the third display module 30 close to the first display module 10 and the second display module 20, which is attracted to the second magnetic member 401b located on the first substrate 101, thereby realizing rapid splicing. The splicing display panel 100 provided by the embodiments of the present application can not only improve the shadow of the splicing display panel at the seam P, but also can realize rapid splicing, thereby improving production efficiency.

It should be understood that in the embodiment of the present application, the first display module 10 and the second display module 20 have the same structure, for the convenience of explanation, the embodiment of the present application divides them into the first display module 10 and the second display module 20.

Further, the first substrate 101 includes a first side 101a close to the second display module 20, the second substrate 102 includes a second side 102a close to the second display module 20, and a distance from the first side 101a of the first substrate 101 to the second display module 20 is less than a distance from the second side 1021a of the second substrate 102 to the second display module 20. The second side 102a of the second substrate 102, the exposed surface of the first substrate 101 close to the second substrate 102 and the side of the second display module 20 close to the first display module 10 are surrounded to form a notch N, and the second magnetic member 401b is disposed in the notch N. In addition, the second magnetic member 401b is attached to the second side 102a of the second substrate 102, the exposed surface of the first substrate 101 close to the second substrate 102, and the surface of the fourth substrate 202 away from the third substrate 201. The second magnetic member 401b disposed in the notch N, therefore, the thickness of the splicing display panel 100 will not be increased, so as to realize the lightness and thinness of the splicing display panel 100.

It should be noted that in the embodiments of the present application, the first substrate 101 and the third substrate 201 may be a driving substrate, the second substrate 102 and the fourth substrate 202 may be a light-emitting functional layer, and the driving substrate may include a substrate and a driving circuit layer on the substrate. The light-emitting functional layer may include structures such as an anode, a light-emitting layer and a cathode. In other words, the first display module 10 and the second display module 20 may be an organic light-emitting diode (OLED) display module, a micro light-emitting diode (Micro LED) display module, and a submillimeter light-emitting diode (Mini LED) display module, etc. The third display module 30 is a Mini LED display module or a Micro LED display module, and the third display module 30 can also be an organic light-emitting diode (OLED) display module.

In some embodiments, the third display module 30 includes an array substrate 303, a flexible circuit board 302 and a display unit 301. The display unit 301 disposed on the array substrate 303, and the display unit 301 is electrically connected with the array substrate 303, the flexible circuit board 302 is electrically connected with the array substrate 303, the flexible circuit board 302 is disposed in the seam P through a through hole h of the first magnetic member 401a. The flexible circuit board 302 disposed between the first display module 10 and the second display module 20. The flexible circuit board 302 disposed in the seam P where the first display module 10 and the second display module 20 are spliced, so that the thickness of the third display module 30 will not increase, so as to realize the lightness and thinness of the splicing display panel 100.

Figure 2:
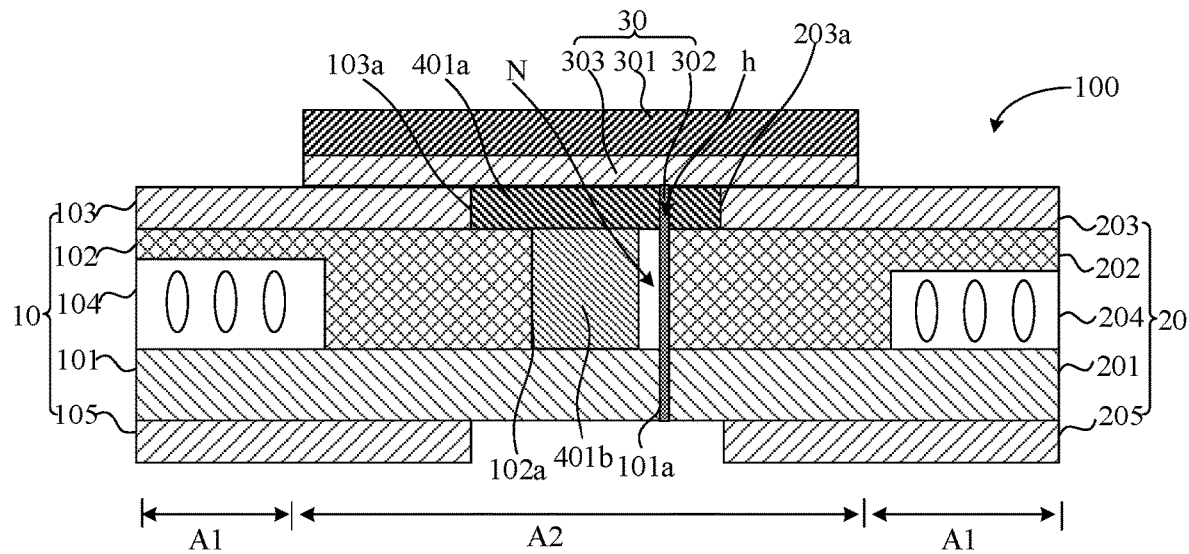
FIG. 2 is a schematic diagram of a second structure of a splicing display panel of one embodiment of the present application.

Please refer to FIG. 2, FIG. 2 is a schematic diagram of a second structure of a splicing display panel of one embodiment of the present application. The splicing display panel 100 has a first display part A1 and a second display part A2, the first display part A1 is located on both sides of the second display part A2, wherein the second display part A2 is a splicing display part.

The splicing display panel 100 includes a first display module 10, a second display module 20, a third display module 30, a first magnetic member 401a and a second magnetic member 401b. The first display module 10 includes a first substrate 101 and a second substrate 102, wherein the second substrate 102 is disposed on the first substrate 101. The second display module 20 located on a side of the first display module 10, wherein the second display module 20 includes a third substrate 201 and a fourth substrate 202, the fourth substrate 202 is disposed on the third substrate 201, the second display module 20 and the first display module 10 are spliced to form a seam P. The third display module 30 disposed on the first display module 10 and the second display module 20, wherein the third display module 30 shields the seam P. The first magnetic member 401a disposed on a surface of the third display module 30 close to the first display module 10 and the second display module 20. The second magnetic member 401b disposed on the first substrate 101. The second magnetic member 401b is attracted to the first magnetic member 401a.

Since the first display module 10 and the second display module 20 are spliced to form the seam P, therefore, in the embodiment of the present application, the third display module 30 is disposed above the first display module 10 and the second display module 20, and which shields the seam P. In addition, the first magnetic member 401a disposed on the surface of the third display module 30 close to the first display module 10 and the second display module 20, which is attracted to the second magnetic member 401b located on the first substrate 101, thereby realizing rapid splicing. The splicing display panel 100 provided by the embodiments of the present application can not only improve the shadow of the splicing display panel at the seam P, but also can realize rapid splicing, thereby improving production efficiency.

Further, the first display module 10 further includes a first polarizer 103, and the first polarizer 103 is disposed on the second substrate 102. the second display module 20 further includes second polarizer 203, the second polarizer 203 is disposed on the fourth substrate 202. the second magnetic member 401b disposed on the first substrate 101 and attached to the second side 102a of the second substrate 102, and the second magnetic member 401b is flush with the second substrate 102. a part of the first magnetic member 401a is attached to a surface of the second magnetic member 401b away from the first substrate 101, and the first magnetic member 401a is attached to a first side 103a of the first polarizer 103 and a first side 203a of the second polarizer 203, and the first magnetic member 401a is flush with the first polarizer 103.

The splicing display panel 100 further includes a first liquid crystal layer 104 disposed between the first substrate 101 and the second substrate 102 and a third polarizer 105 disposed on the side of the first substrate 101 away from the second substrate 102. The splicing display panel 100 further includes a second liquid crystal layer 204 disposed between the third substrate 201 and the fourth substrate 202 and a fourth polarizer 205 disposed on the side of the third substrate 201 away from the fourth substrate 202.

It should be noted that the first substrate 101 is a driving substrate and the second substrate 102 is a color film substrate, the third substrate 201 is a driving substrate and the fourth substrate is a color film substrate. The driving substrate may include a substrate and a driving circuit layer on the substrate. The third display module 30 is a submillimeter light-emitting diode (Mini LED) display module or a micro light-emitting diode (Micro LED) display module. The third display module 30 includes an array substrate 303, a flexible circuit board 302 and a display unit 301. The flexible circuit board 302 disposed between the first display module 10 and the second display module 20. The flexible circuit board 302 disposed in the seam P where the first display module 10 and the second display module 20 are spliced, so that the thickness of the third display module 30 will not increase, so as to realize the lightness and thinness of the splicing display panel 100.

Referring to FIG. 1 or FIG. 2, the flexible circuit board 302 is disposed on the surface of the array substrate 303 away from the display unit 301, and the flexible circuit board 302 is disposed in the seam P through a through hole h of the first magnetic member 401a. The flexible circuit board 302 provided by the embodiment of the present application is disposed on the surface of the array substrate 303 away from the display unit 301, therefore, the thickness of the third display module 30 will not be increased, so as to realize the lightness and thinness of the splicing display panel 100 further.

Figure 3:
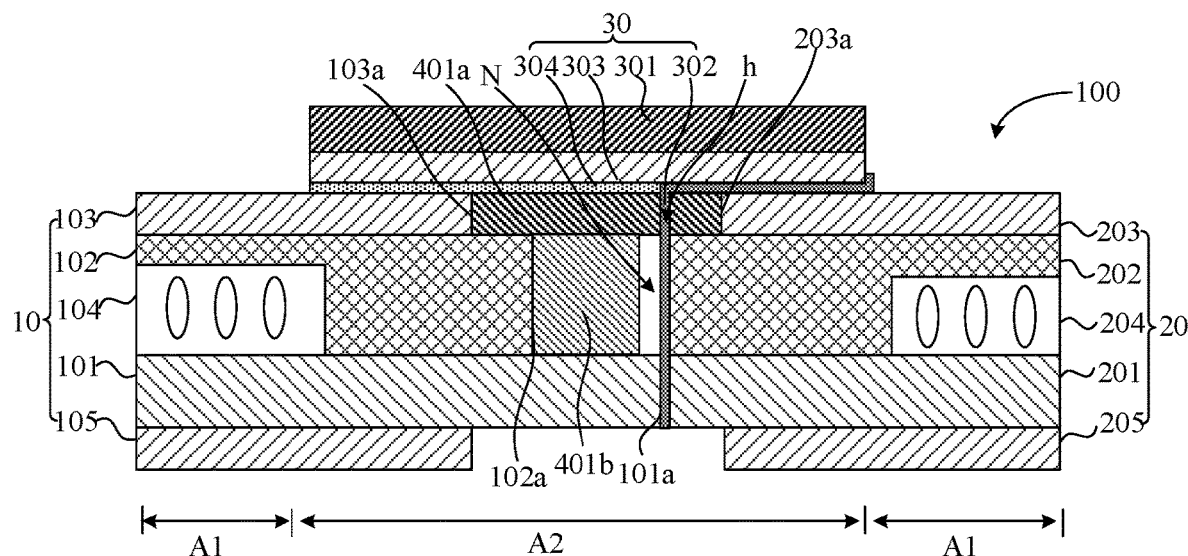
FIG. 3 is a schematic diagram of a third structure of a splicing display panel of one embodiment of the present application.

Referring to FIG. 3, FIG. 3 is a schematic diagram of a third structure of a splicing display panel of one embodiment of the present application, the flexible circuit board 302 disposed on the side of the array substrate 303, and the flexible circuit board 302 is bent into the seam P through the through hole h from the side of the array substrate 303. The third display module 30 further includes a planarization layer 304 disposed on the surface of the array substrate 303 away from the display unit 301, wherein, the planarization layer 304 is used to flatten the gap formed between the array substrate 303 and the first magnetic member 401a when the flexible circuit board 302 is bent into the seam P through the through hole h from the side of the array substrate 303. When the flexible circuit board 302 in the embodiment of the present application is bent from the side of the array substrate 303 through the through hole h into the seam P, there is a gap between the surface of the array substrate 303 away from the display unit 301 and the first magnetic member 401a, and the planarization layer 304 is used to flatten the gap, thereby improving the flatness of the splicing display panel 100 and further improving the stability of the splicing display panel 100.

Further, the first substrate 101 includes a first side 101a close to the second display module 20, the second substrate 102 includes a second side 102a close to the second display module 20, and a distance from the first side 101a of the first substrate 101 to the second display module 20 is less than a distance from the second side 1021a of the second substrate 102 to the second display module 20. The second side 102a of the second substrate 102, the exposed surface of the first substrate 101 close to the second substrate 102 and the side of the second display module 20 close to the first display module 10 are surrounded to form a notch N, and the second magnetic member 401b is disposed in the notch N. In addition, the second magnetic member 401b is attached to the second side 102a of the second substrate 102, the exposed surface of the first substrate 101 close to the second substrate 102, and the surface of the fourth substrate 202 away from the third substrate 201.

In the splicing display panel 100 provided by the embodiment of the present application, the second magnetic member 401b is disposed in the notch N, and the second magnetic member 401b is attached to the second side 102a of the second substrate 102 and is flush with the second substrate 102. The first magnetic member 401a is attached to the first side 103a of the first polarizer 103 and the first side 203a of the third polarizer 203, and the first magnetic member 401a and the second magnetic member 401b are attracted to each other, thereby realizing rapid splicing. The splicing display panel 100 provided by the embodiment of the present application can not only improve the shadow of the splicing display panel at the seam, but also can realize simple and rapid splicing, thereby improving production efficiency.

In some embodiments, the first magnetic member 401a includes at least one of a magnetic coating, a magnetic adhesive layer and a magnet. The second magnetic member 401b includes at least one of the magnetic coating and the magnetic adhesive layer. Wherein, the magnetic coating is made of magnetic particles mixed with organic polymers. The magnetic adhesive layer is made of magnetic particles mixed with optical adhesives. The magnetic particles include at least one of iron, cobalt, nickel, manganese or metal oxides of iron, cobalt, nickel, manganese.

Since the optical adhesives has a binding effect, magnetic particles can be mixed with the optical adhesives, and coating in the notch N, and then the optical adhesives mixed with the magnetic particles can be cured by ultraviolet light, thereby forming a magnetic adhesive layer. The magnetic adhesive layer can be directly attached to the first substrate 101 and the second side 102a of the second substrate 102. Therefore, when the first magnetic member 401a and the second magnetic member 401b are magnetic adhesive layers, the magnetic adhesive layer is firmly attached to the first substrate 101 and the second substrate 102, thereby improving the stability of the splicing display panel 100.

In addition, magnetic metal oxides such as iron, cobalt, nickel, manganese or metal oxides of iron, cobalt, nickel, and manganese have the advantages of strong adsorption capacity and wide acquisition channels.

It should be noted that the optical adhesives of the embodiment may be one or any combination of organic silica gel, acrylic resin, unsaturated polyester, polyurethane, and epoxy resin.

Figure 4:
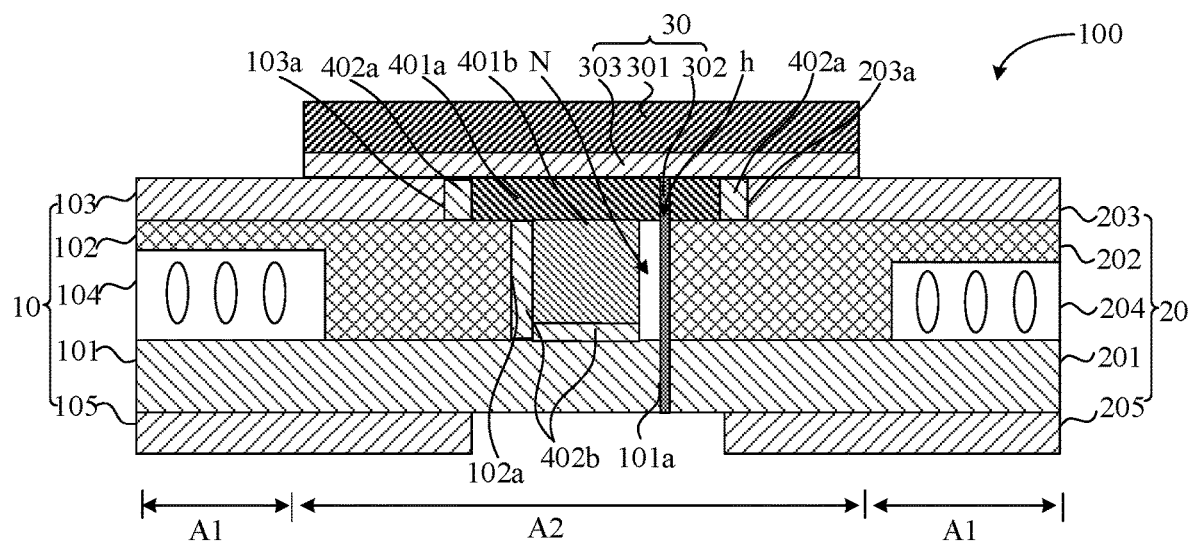
FIG. 4 is a schematic diagram of a fourth structure of a splicing display panel of one embodiment of the present application.

Referring to FIG. 4, FIG. 4 is a schematic diagram of a fourth structure of a splicing display panel of one embodiment of the present application. The first magnetic member 401a is one of the magnetic coating or the magnet, the splicing display panel 100 further includes a first adhesive layer 402a, the first adhesive layer 402a is disposed on the first side 103a of the first polarizer 103 and the first side 203a of the second polarizer 203, and the first adhesive layer 402a is used for bonding the first magnetic member 401a with the first polarizer 103 and the second polarizer 203.

The second magnetic member 401b is the magnetic coating. The splicing display panel 100 further includes a second adhesive layer 402b, the second adhesive layer 402b is disposed on the side of the first substrate 101 close to the second magnetic member 401b, and the second adhesive layer 402b is disposed on the second side of the second substrate 102, and the second adhesive layer 402b is used for bonding the magnetic coating with the first substrate 101 and the second substrate 102.

In the embodiment of the present application, the first magnetic member 401a, the first polarizer 103 and the second polarizer 203 are bonded by the first adhesive layer 402a. The second magnetic member 401b, the second magnetic member 401b and the second magnetic member 401b are bonded by the second adhesive layer 402b. The first adhesive layer 402a and the second adhesive layer 402b are used to prevent the first magnetic member 401a and the second magnetic member 401b falling off, thereby improving the stability of the splicing display panel 100.

In some embodiments, a width of the second magnetic member 401b is less than or equal to 3 micrometers. For example, the width of the second magnetic member 401b may be any one of 0.5 micrometers, 1.0 micrometers, 1.2 micrometers, 1.5 micrometers, 2.2 micrometers or 3.0 micrometers. In the embodiment of the present application, the width of the second magnetic member 401b is defined to be less than or equal to 3 microns, so that the second magnetic member 401b has a sufficient width to fit the first substrate 101 and the second substrate 102 to prevent the second magnetic member 401b falling off, thereby further improving the stability of the splicing display panel 100.

Figure 5:
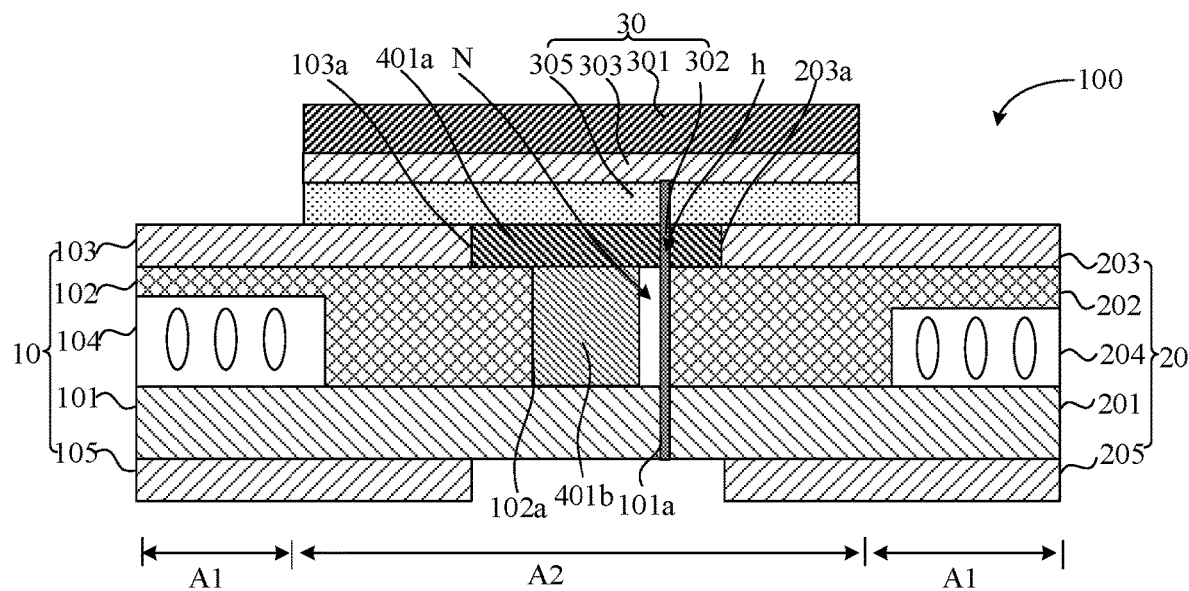
FIG. 5 is a schematic diagram of a fifth structure of a splicing display panel of one embodiment of the present application.

Referring to FIG. 5, FIG. 5 is a schematic diagram of a fifth structure of a splicing display panel of one embodiment of the present application.

The third display module 30 further includes a magnetic layer 305, the magnetic layer 305 is disposed above the first display module 10 and the second display module 20, and the magnetic layer 305 is attracted to the first magnetic member 401a.

A material of the magnetic layer 305 may be an ultra-thin iron plate, an ultra-thin cobalt sheet, an ultra-thin nickel sheet, an ultra-thin manganese sheet or an ultra-thin device containing metal oxides such as iron, cobalt, nickel and manganese.

In the embodiment of the present application, the magnetic layer 305 is carried under the display unit 301, so that the third display module 30 can be magnetically attracted to the first magnetic member 401a, which simplifies the splicing step of the splicing display panel 100.

Figure 6:
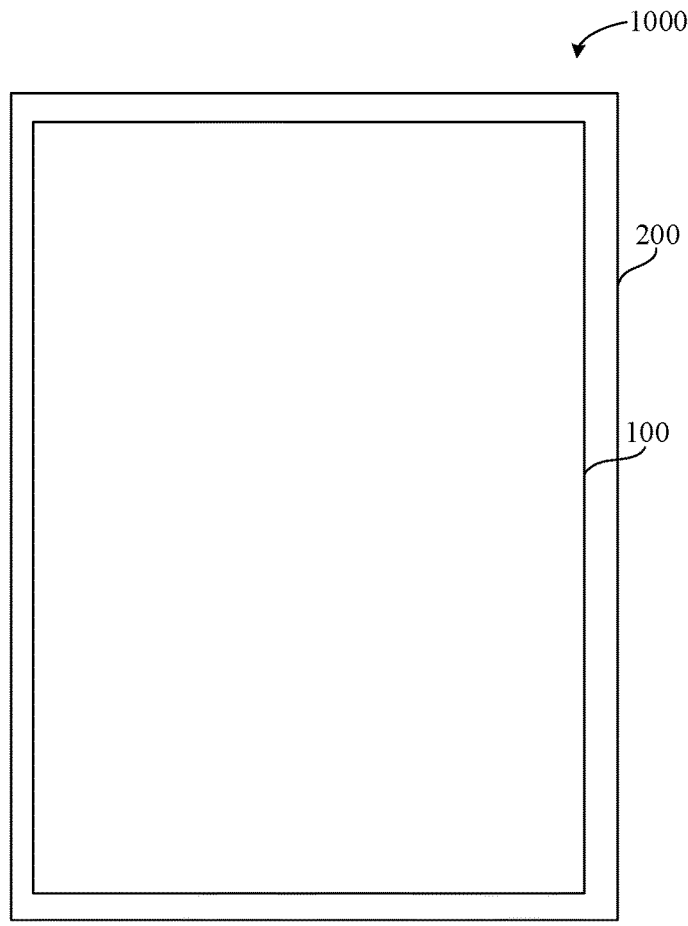
FIG. 6 is a schematic diagram of a planar structure of an electronic device of one embodiment of the present application.

Referring to FIG. 6, FIG. 6 is a schematic diagram of a planar structure of an electronic device of one embodiment of the present application.

The electronic device includes a housing 200 and a splicing display panel disposed in the housing 200. The splicing display panel may be the splicing display panel 100 described in any of the foregoing embodiments, which will not be repeated here.

It should be noted that the electronic device 1000 provided in the embodiment of the present application may be at least one of a smart phone, a tablet personal computer, a mobile phone, a video phone, or an e-book reader, desktop PC, laptop PC, netbook computer, workstation, server, personal digital assistant, portable multimedia player, MP3 player, a mobile medical device, a camera, a game console, a digital camera, a car navigation system, an electronic billboard, an automatic teller machine, or a wearable device. In particular, the electronic device may be a large display device.

In summary, although the present application has been disclosed in preferred embodiments as above, the above-mentioned preferred embodiments are not intended to limit the present application. Those of ordinary skill in the art can make various modifications without departing from the spirit and scope of the present application. Such changes and modifications, therefore, the protection scope of the present application is subject to the scope defined by the claims.

What is claimed is:

1. A splicing display panel, comprising:
    a first display module comprising a first substrate and a second substrate, wherein the second substrate is disposed on the first substrate;
    a second display module located on a side of the first display module, wherein the second display module comprises a third substrate and a fourth substrate, the fourth substrate is disposed on the third substrate, and the second display module and the first display module are spliced to form a seam;
    a third display module disposed on the first display module and the second display module, wherein the third display module shields the seam;
    a first magnetic member disposed on a surface of the third display module close to the first display module and the second display module; and
    a second magnetic member disposed on at least one of the first substrate and the third substrate, wherein the second magnetic member is attracted to the first magnetic member; and
    wherein the first substrate comprises a first side close to the second display module, the second substrate comprises a second side close to the second display module, and a distance from the first side of the first substrate to the second display module is less than a distance from the second side of the second substrate to the second display module; and
    the second side of the second substrate, an exposed surface of the first substrate close to the second substrate, and the side of the second display module close to the first display module are surrounded to form a notch, and the second magnetic member is disposed in the notch.

2. The splicing display panel according to claim 1, wherein the first display module further comprises a first polarizer, and the first polarizer is disposed on the second substrate;
    the second display module further comprises second polarizer, the second polarizer is disposed on the fourth substrate;
    the second magnetic member disposed on the first substrate and attached to the second side of the second substrate, and the second magnetic member is flush with the second substrate; and
    a part of the first magnetic member is attached to a surface of the second magnetic member away from the first substrate, the first magnetic member is attached to a first side of the first polarizer and a first side of the second polarizer, and the first magnetic member is flush with the first polarizer.

3. The splicing display panel according to claim 2, wherein the first magnetic member comprises at least one of a magnetic coating, a magnetic adhesive layer, and a magnet, and the second magnetic member comprises at least one of a magnetic coating and a magnetic adhesive layer.

4. The splicing display panel according to claim 3, wherein the magnetic coating is made of magnetic particles mixed with organic polymers.

5. The splicing display panel according to claim 3, wherein the magnetic adhesive layer is made of magnetic particles mixed with optical adhesives.

6. The splicing display panel according to claim 4, wherein the magnetic particles comprise at least one of iron, cobalt, nickel, manganese or metal oxides of iron, cobalt, nickel, manganese.

7. The splicing display panel according to claim 3, wherein when the first magnetic member is one of the magnetic coating or the magnet, the splicing display panel further comprises a first adhesive layer, the first adhesive layer is disposed on the first side of the first polarizer and the first side of the second polarizer, and the first adhesive layer is used for bonding the first magnetic member with the first polarizer and the second polarizer.

8. The splicing display panel according to claim 3, wherein when the second magnetic member is the magnetic coating, the splicing display panel further comprises a second adhesive layer, the second adhesive layer is disposed on the side of the first substrate close to the second magnetic member, and the second adhesive layer is disposed on the second side of the second substrate, and the second adhesive layer is used for bonding the magnetic coating with the first substrate and the second substrate.

9. The splicing display panel according to claim 2, wherein a width of the second magnetic member is less than or equal to 3 microns.

10. The splicing display panel according to claim 1, wherein the splicing display panel further comprises a first liquid crystal layer disposed between the first substrate and the second substrate and a third polarizer disposed on the side of the first substrate away from the second substrate, the first substrate is a driving substrate and the second substrate is a color film substrate;
the splicing display panel further comprises a second liquid crystal layer disposed between the third substrate and the fourth substrate and a fourth polarizer disposed on the side of the third substrate away from the fourth substrate, the third substrate is a driving substrate and the fourth substrate is a color film substrate;
the third display module comprises a flexible circuit board, the flexible circuit board is disposed between the first display module and the second display module, and the third display module is a mini light-emitting diode (LED) display module or a micro LED display module.

11. The splicing display panel according to claim 10, wherein the third display module further comprises an array substrate and a display unit disposed on the array substrate, the display unit is electrically connected with the array substrate, the flexible circuit board is electrically connected with the array substrate, and the flexible circuit board is disposed in the seam through a through hole of the first magnetic member.

12. The splicing display panel according to claim 11, wherein the flexible circuit board is disposed on the surface of the array substrate away from the display unit, and the flexible circuit board is disposed in the seam through the through hole.

13. The splicing display panel according to claim 11, wherein the flexible circuit board is disposed on the side of the array substrate, and the flexible circuit board is bent into the seam through the through hole from the side of the array substrate;
the third display module further comprises a planarization layer disposed on the surface of the array substrate away from the display unit, wherein, the planarization layer is used to flatten the gap formed between the array substrate and the first magnetic member when the flexible circuit board is bent into the seam through the through hole from the side of the array substrate.

14. The splicing display panel according to claim 10, wherein the third display module further comprises a magnetic layer, the magnetic layer is disposed above the first display module and the second display module, and the magnetic layer is attracted to the first magnetic member.

15. An electronic device, comprising a shell and a splicing display panel, wherein the splicing display panel is disposed in the shell, and the splicing display panel comprises:
a first display module comprising a first substrate and a second substrate, wherein the second substrate is disposed on the first substrate;
a second display module located on a side of the first display module, wherein the second display module comprises a third substrate and a fourth substrate, the fourth substrate is disposed on the third substrate, and the second display module and the first display module are spliced to form a seam;
a third display module disposed on the first display module and the second display module, wherein the third display module shields the seam;
a first magnetic member disposed on a surface of the third display module close to the first display module and the second display module; and
a second magnetic member disposed on at least one of the first substrate and the third substrate, wherein the second magnetic member is attracted to the first magnetic member; and
wherein the first substrate comprises a first side close to the second display module, the second substrate comprises a second side close to the second display module, and a distance from the first side of the first substrate to the second display module is less than a distance from the second side of the second substrate to the second display module; and
the second side of the second substrate, an exposed surface of the first substrate close to the second substrate, and the side of the second display module close to the first display module are surrounded to form a notch, and the second magnetic member is disposed in the notch.

16. The electronic device according to claim 15, wherein the first display module further comprises a first polarizer, and the first polarizer is disposed on the second substrate;
the second display module further comprises second polarizer, the second polarizer is disposed on the fourth substrate;
the second magnetic member disposed on the first substrate and attached to the second side of the second substrate, and the second magnetic member is flush with the second substrate; and
a part of the first magnetic member is attached to the surface of the second magnetic member away from the first substrate, the first magnetic member is attached to a first side of the first polarizer and a first side of the second polarizer, and the first magnetic member is flush with the first polarizer.

17. The electronic device according to claim 15, wherein the splicing display panel further comprises a first liquid crystal layer disposed between the first substrate and the second substrate and a third polarizer disposed on the side of the first substrate away from the second substrate, the first substrate is a driving substrate and the second substrate is a color film substrate;

the splicing display panel further comprises a first liquid crystal layer disposed between the third substrate and the fourth substrate and a fourth polarizer disposed on the side of the third substrate away from the fourth substrate, the third substrate is a driving substrate and the fourth substrate is a color film substrate;

the third display module comprises a flexible circuit board, the flexible circuit board is disposed between the first display module and the second display module, and the third display module is a mini light-emitting diode (LED) display module or a micro LED display module.

18. The electronic device according to claim 17, wherein the third display module further comprised a magnetic layer, the magnetic layer is disposed above the first display module and the second display module, and the magnetic layer is attracted to the first magnetic member.

19. The splicing display panel according to claim 1, wherein each of the first display module, the second display module, and the third display module is any one of an organic light-emitting diode (OLED) display module, a micro light-emitting diode (Micro LED) display module, and a submillimeter light-emitting diode (Mini LED) display module.

20. A splicing display panel, comprising:
a first display module comprising a first substrate, a second substrate disposed on the first substrate, a first liquid crystal layer disposed between the first substrate and the second substrate, and a third polarizer disposed on a side of the first substrate away from the second substrate, wherein the first substrate is a driving substrate and the second substrate is a color film substrate;
a second display module located on a side of the first display module, wherein the second display module comprises a third substrate, a fourth substrate disposed on the third substrate, a second liquid crystal layer disposed between the third substrate and the fourth, and a fourth polarizer disposed on a side of the third substrate away from the fourth substrate, the third substrate is a driving substrate and the fourth substrate is a color film substrate, and the second display module and the first display module are spliced to form a seam;
a third display module disposed on the first display module and the second display module, wherein the third display module shields the seam, the third display module comprises a flexible circuit board, the flexible circuit board is disposed between the first display module and the second display module, and the third display module is a mini light-emitting diode (LED) display module or a micro LED display module;
a first magnetic member disposed on a surface of the third display module close to the first display module and the second display module; and
a second magnetic member disposed on at least one of the first substrate and the third substrate, wherein the second magnetic member is attracted to the first magnetic member.

* * * * *